(12) United States Patent
Chen

(10) Patent No.: US 10,559,603 B2
(45) Date of Patent: Feb. 11, 2020

(54) DISPLAY PANEL AND DISPLAY APPARATUS THEREOF

(71) Applicant: SHANGHAI TIANMA MICRO-ELECTRONICS CO., LTD., Shanghai (CN)

(72) Inventor: Donghua Chen, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 43 days.

(21) Appl. No.: 15/974,958

(22) Filed: May 9, 2018

(65) Prior Publication Data

US 2019/0244974 A1 Aug. 8, 2019

(30) Foreign Application Priority Data

Feb. 8, 2018 (CN) .......................... 2018 1 0128628

(51) Int. Cl.
*G09G 5/00* (2006.01)
*H05K 1/11* (2006.01)
(Continued)

(52) U.S. Cl.
CPC .......... *H01L 27/124* (2013.01); *G02F 1/1368* (2013.01); *G02F 1/13452* (2013.01);
(Continued)

(58) Field of Classification Search
CPC ........ H05K 1/111; H05K 1/114; H05K 1/115; H05K 1/117; H05K 1/118; H05K 1/147; H05K 1/189; H05K 1/0281; H05K 3/361; H05K 3/403; H05K 2201/09409; H05K 2201/09481; H05K 2201/09145; H05K 2201/09709; G09G 2320/0223; G09G 2300/0426

See application file for complete search history.

(56) References Cited

U.S. PATENT DOCUMENTS

| 3,908,178 A | * | 9/1975 | Johnson ................... H03H 7/24 333/81 R |
| 4,999,656 A | * | 3/1991 | Shimizu ................. G03B 17/14 396/529 |

(Continued)

FOREIGN PATENT DOCUMENTS

CN         107229374 A        10/2017

*Primary Examiner* — Michael J Eurice
(74) *Attorney, Agent, or Firm* — Anova Law Group PLLC

(57) ABSTRACT

A display panel and a display apparatus are provided. A display panel includes a display region and a bonding region bonding a flexible circuit board with the display panel. The bonding region comprises a first surface located at a displaying side of the display panel and an opposing second surface, and includes a plurality of first pins and a plurality of second pins. The plurality of first pins are disposed at the first surface of the bonding region, and the plurality of second pins are disposed at the second surface of the bonding region. The display panel also includes a plurality of first transmission lines and a plurality of second transmission lines. A first transmission line is connected to a first pin, a second transmission line is connected to a second pin, and the second transmission line and the second pin are disposed at different film layers.

19 Claims, 10 Drawing Sheets

(51) Int. Cl.
  *H05K 1/14*    (2006.01)
  *H05K 3/40*    (2006.01)
  *H01L 27/12*   (2006.01)
  *H05K 1/18*    (2006.01)
  *G02F 1/1333*  (2006.01)
  *G02F 1/1368*  (2006.01)
  *H01L 51/50*   (2006.01)
  *G02F 1/1345*  (2006.01)
  *G09G 3/20*    (2006.01)
  *G09G 1/16*    (2006.01)

(52) U.S. Cl.
  CPC ........ *G02F 1/133308* (2013.01); *H01L 51/50* (2013.01); *H05K 1/189* (2013.01); *G09G 1/165* (2013.01); *G09G 1/167* (2013.01); *G09G 3/2092* (2013.01); *G09G 3/2096* (2013.01); *G09G 5/003* (2013.01); *G09G 2310/0286* (2013.01); *H01L 2251/5315* (2013.01); *H05K 2201/10128* (2013.01)

(56) References Cited

U.S. PATENT DOCUMENTS

| | | | | |
|---|---|---|---|---|
| 5,527,591 | A * | 6/1996 | Crotzer | H01H 1/06 428/209 |
| 5,743,751 | A * | 4/1998 | Davis | H01R 12/7023 439/79 |
| 6,353,539 | B1 * | 3/2002 | Horine | H05K 1/0248 228/180.21 |
| 6,369,336 | B1 * | 4/2002 | Obata | H01R 12/714 174/266 |
| 6,380,918 | B1 * | 4/2002 | Chiba | G02F 1/13452 345/90 |
| 9,355,950 | B1 * | 5/2016 | Bayerer | H01L 23/49833 |
| 2003/0020152 | A1 * | 1/2003 | Inoue | H01L 23/057 257/684 |
| 2003/0164548 | A1 * | 9/2003 | Lee | H01L 23/13 257/738 |
| 2003/0179551 | A1 * | 9/2003 | Sugimoto | H05K 3/361 361/748 |
| 2004/0014335 | A1 * | 1/2004 | Igarashi | H01R 12/716 439/74 |
| 2004/0156177 | A1 * | 8/2004 | Higashitani | H01L 23/3107 361/777 |
| 2006/0042823 | A1 * | 3/2006 | Oda | H05K 1/117 174/250 |
| 2006/0157271 | A1 * | 7/2006 | Miura | H05K 1/118 174/250 |
| 2006/0226861 | A1 * | 10/2006 | Hoshino | H05K 1/118 361/749 |
| 2007/0102830 | A1 * | 5/2007 | Muto | H05K 1/0219 257/784 |
| 2007/0120425 | A1 * | 5/2007 | Ishida | H05K 3/225 307/147 |
| 2008/0012474 | A1 * | 1/2008 | Sung | H01L 27/3276 313/504 |
| 2008/0083554 | A1 * | 4/2008 | Biskeborn | H05K 3/361 174/117 F |
| 2008/0176035 | A1 * | 7/2008 | Shih | H05K 3/243 428/131 |
| 2009/0302468 | A1 * | 12/2009 | Baek | H01L 24/11 257/738 |
| 2010/0133510 | A1 * | 6/2010 | Kim | B01L 3/502715 257/24 |
| 2011/0114379 | A1 * | 5/2011 | Chen | H05K 1/029 174/261 |
| 2011/0147752 | A1 * | 6/2011 | Yamazaki | G02F 1/133553 257/59 |
| 2011/0253431 | A1 * | 10/2011 | Park | H05K 3/244 174/257 |
| 2011/0266042 | A1 * | 11/2011 | Beaman | H05K 1/117 174/261 |
| 2013/0039025 | A1 * | 2/2013 | Chen | H05K 1/0295 361/767 |
| 2013/0341075 | A1 * | 12/2013 | Becker | H05K 1/0281 174/255 |
| 2014/0111116 | A1 * | 4/2014 | Shin | H01L 27/3279 315/312 |
| 2014/0145161 | A1 * | 5/2014 | Naijo | H01L 51/0097 257/40 |
| 2015/0027754 | A1 * | 1/2015 | Shimoda | B32B 27/281 174/251 |
| 2015/0136448 | A1 * | 5/2015 | Sasaki | H05K 1/0281 174/251 |
| 2015/0163939 | A1 * | 6/2015 | Park | G02F 1/13452 361/749 |
| 2016/0072094 | A1 * | 3/2016 | Kim | H01L 51/529 315/112 |
| 2016/0155788 | A1 * | 6/2016 | Kwon | H01L 27/3276 257/40 |
| 2016/0234936 | A1 * | 8/2016 | Okuno | G11B 5/60 |
| 2016/0270229 | A1 * | 9/2016 | Tanabe | G11B 5/4833 |
| 2017/0179423 | A1 * | 6/2017 | Kwon | H01L 27/323 |
| 2018/0031881 | A1 * | 2/2018 | Kubota | G02F 1/133553 |
| 2018/0039146 | A1 * | 2/2018 | Tanaka | G02F 1/1343 |
| 2018/0175323 | A1 * | 6/2018 | Ahn | H01L 51/5253 |
| 2018/0356300 | A1 * | 12/2018 | Park | G01L 1/142 |
| 2018/0364112 | A1 * | 12/2018 | Park | G01L 1/144 |
| 2019/0097339 | A1 * | 3/2019 | Lim | H01R 12/772 |

* cited by examiner

DISPLAY PANEL AND DISPLAY APPARATUS THEREOF

CROSS-REFERENCES TO RELATED APPLICATIONS

This application claims priority of Chinese Patent Application No. 201810128628.8, filed on Feb. 8, 2018, the entire contents of which are hereby incorporated by reference.

FIELD OF THE INVENTION

The present disclosure generally relates to the field of display technology and, more particularly, relates to a display panel and a display apparatus thereof.

BACKGROUND

In existing technologies, a display panel is often connected to a main circuit board through a flexible circuit board. The flexible circuit board transmits electric signals between the display panel and the main circuit board. The flexible circuit board is often bonded with the display panel to form an electrical connection between the flexible circuit board and the display panel. In particular, the flexible circuit board has a plurality of golden fingers, and the display panel has a plurality of pins. The plurality of golden fingers and the plurality of pins are one-to-one correspondingly connected to realize the electrical signal transmission between the flexible circuit and the display panel.

As the demand for the resolution of a display screen increases, when two display screens have a same size, the display screen having a higher resolution has more pixels. Correspondingly, more pins have to be disposed on the display panel to transmit electric signals. Increasing the bonding width of the flexible circuit board to increase the number of the golden fingers, the bonding precision may be reduced, and the bonding difficulty may be increased. Thus, it is desired to increase the bonding precision of the high-resolution display screen, and reduce the bonding difficulty of the high-resolution display screen.

The disclosed display panel and display apparatus are directed to solve one or more problems set forth above and other problems in the art.

BRIEF SUMMARY OF THE DISCLOSURE

One aspect of the present disclosure provides a display panel. The display panel includes a display region and a bonding region bonding a flexible circuit board with the display panel. The bonding region comprises a first surface located at a displaying side of the display panel and an opposing second surface, the bonding region includes a plurality of first pins and a plurality of second pins, the plurality of first pins are disposed at the first surface of the bonding region, and the plurality of second pins are disposed at the second surface of the bonding region. Further, the display panel may include a plurality of first transmission lines and a plurality of second transmission lines. A first transmission line of the plurality of first transmission lines is connected to a first pin of the plurality of first pins, a second transmission line of the plurality of second transmission lines is connected to a second pin of the plurality of second pins, the second transmission line and the second pin are disposed on different film layers, and the plurality of first transmission lines and the plurality of second transmission lines transmit a display signal.

Another aspect of the present disclosure provides a display apparatus. The display apparatus includes a display panel. The display panel includes a display region and a bonding region bonding a flexible circuit board with the display panel. The bonding region comprises a first surface located at a displaying side of the display panel and an opposing second surface, the bonding region includes a plurality of first pins and a plurality of second pins, the plurality of first pins are disposed at the first surface of the bonding region, and the plurality of second pins are disposed at the second surface of the bonding region. Further, the display panel may include a plurality of first transmission lines and a plurality of second transmission lines. A first transmission line of the plurality of first transmission lines is connected to a first pin of the plurality of first pins, a second transmission line of the plurality of second transmission lines is connected to a second pin of the plurality of second pins, the second transmission line and the second pin are disposed on different film layers, and the plurality of first transmission lines and the plurality of second transmission lines transmit a display signal.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure. Further, in the present disclosure, the disclosed embodiments and the features of the disclosed embodiments may be combined under conditions without conflicts.

The present disclosure provides a display panel capable of disposing more pins in the bonding region and, meanwhile, increasing bonding accuracy, reducing bonding difficulty and increasing yield.

Figure 1:
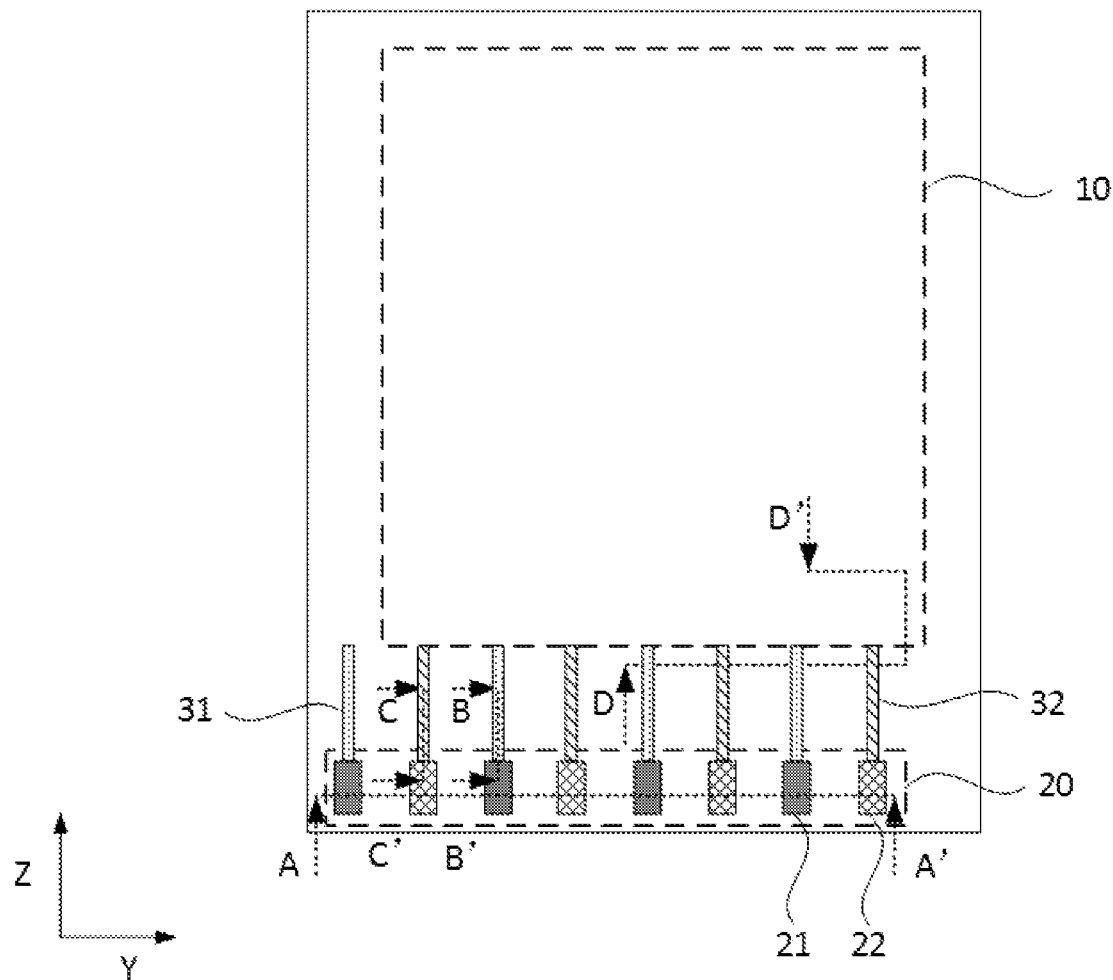
FIG. 1 illustrates an exemplary display panel consistent with various disclosed embodiments.
Figure 2:
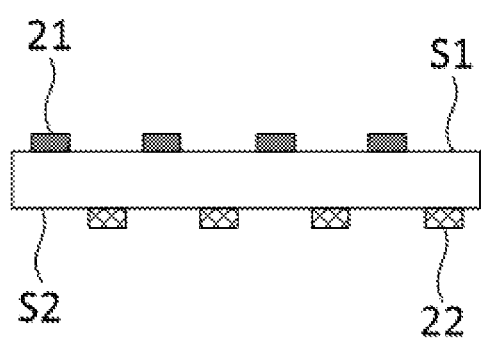
FIG. 2 illustrates an AA'-sectional view of an exemplary display panel in FIG. 1.
Figure 3:
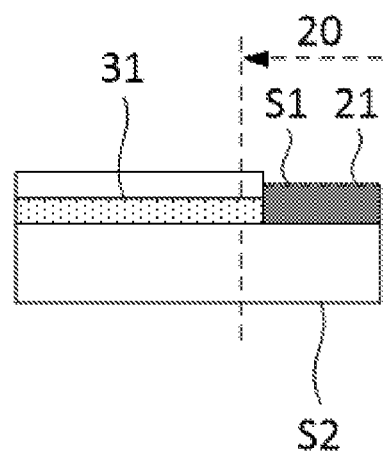
FIG. 3 illustrates a BB'-sectional view of another exemplary display panel in FIG. 1.
Figure 4:
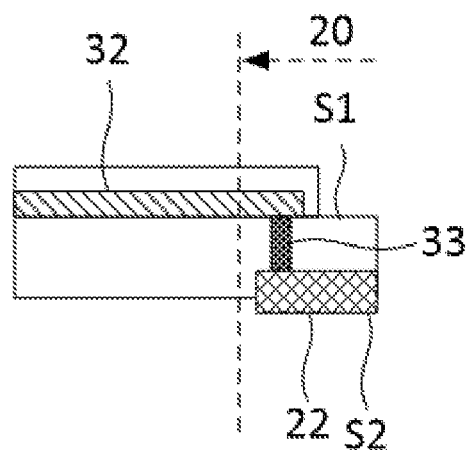
FIG. 4 illustrates a CC'-sectional view of another exemplary display panel in FIG. 1.

FIG. 1 illustrates an exemplary display panel consistent with various disclosed embodiments. FIG. 2 is an AA'-sectional view of an exemplary display panel in FIG. 1. FIG. 3 is a BB' sectional view of another exemplary display panel in FIG. 1. FIG. 4 is a CC'-sectional view of another exemplary display panel in FIG. 1.

As shown in FIG. 1-FIG. 4, the display panel may include a display region 10 and a bonding region 20. The bonding region 20 may bond the display panel to a flexible circuit board. The bonding region 20 may include a first surface S1 and an opposing second surface S2 arranged opposite to the first surface S. The display panel may include a displaying surface (i.e., a surface displaying images and facing viewers) and a non-displaying surface (i.e., the surface opposite to the displaying surface). The first surface S1 may be located at the displaying surface of the display panel. The bonding region 20 may include a plurality of first pins 21 and a plurality of second pins 22. The first pins 21 may be disposed at the first surface S1, and the second pins 22 may be disposed at the second surface S2.

The display panel may also include a plurality of first transmission lines 31 and a plurality of second transmission lines 32. A first transmission line 31 may be connected with a first pin 21, and a second transmission line 32 may be connected with a second pin 22. The first transmission lines 31 and the second transmission lines 32 may be used to transmit display signals. The second transmission lines 32 and the second pins 22 may be disposed at different layers.

In one embodiment, the display region 10 may include a plurality of pixels emitting red light, green light and blue light to form color images. In another embodiment, the display panel may also include pixels emitting white light. According to the display principle, in one embodiment, the display panel may be an organic light-emitting display panel. The organic light-emitting display panel may be a self-emitting display panel, and may include a plurality of organic light-emitting diodes (OLEDs) emitting light. An OLED may include an anode, a cathode and an organic light-emitting layer between the anode and the cathode. In another embodiment, the display panel may be a liquid-crystal display (LCD) panel. The liquid-crystal display panel may include a backlight module and a liquid-crystal layer. The backlight module may be used as a backlight source of the liquid-crystal display panel, and provide light for the liquid-crystal display panel. Combining with a polarizer, the liquid-crystal layer may be used as light switches to control the emission of the backlight from the liquid-crystal display panel. The display panel may also be any other appropriate display panels capable of displaying images/videos, which is not limited by the present disclosure.

The bonding region 20 of the display panel may bond the display panel to the flexible circuit board. In one embodiment, one end of the flexible circuit board may be bonded with the display panel to form an electrical connection, and another end of the flexible circuit board may be bonded with a main circuit board to form another electrical connection. The main circuit board may provide display signals for the display panel. The main circuit board may often be a printed circuit board (PCB), however, the type of the main circuit board is not limited by the present disclosure. Because the PCB is often a rigid board, the flexible circuit board may form a soft electrical connection between the display panel and the main circuit board.

In one embodiment, as shown in FIGS. 1-4, the bonding region 20 may include the first surface S1 and the opposing second surface S2. The first surface S1 may be disposed at the displaying surface of the display panel, and the second surface S2 may be disposed at the non-displaying surface of the display panel. The bonding region 20 may include a plurality of first pins 21 and a plurality of second pins 22. The first pins 21 may be located at the first surface S1, and the second pins 22 may be located at the second surface S2. Through disposing the first pins 21 and the second pins 22 respectively at the first surface S1 of the display panel and the second surface S2 of the display panel, given a constant length of the bonding region 20, the area available for disposing the first pins 21 and the second pins 22 in the bonding region may be doubled. Thus, more pins may be able to be disposed at the bonding region 20. For a high-resolution display screen, the to-be-transmitted display signals may be increased accordingly.

Thus, on one hand, provided that the length of the bonding region 20, the width of the pin and a gap between adjacent pins are not changed, i.e., the bonding accuracy and bonding difficulty remain substantially the same, the number of the pins may be increased, which may be highly desired by the high-resolution display panel.

On the other hand, because the area for disposing the pins may be increased, through increasing the width of the pin and the gap between two adjacent pins, the bonding accuracy of the flexible circuit board may be increased, the bonding difficulty of the flexible circuit board may be reduced, and the process reliability may be increased.

It should be noted that, the position relationship of the first pins and the second pins along a direction perpendicular to the display panel is not limited by this embodiment. Further, the thickness of the first pins and the thickness of the second pins are not limited by the present disclosure. In the accompany drawings, the embedding relationship between the pins and the adjacent film is for illustrative purposes only, and is not intended to limit the scope of the present disclosure. In practical applications, the embedding relationship between the pins and the adjacent film may be determined according to various application scenarios. For example, in one embodiment, the pins may be disposed on the surface of the adjacent film, and in another embodiment, the pins may be at least partially embedded in the adjacent film, which is not limited by the present disclosure.

In the disclosed embodiments, the display panel may also include the plurality of first transmission lines 31 and the plurality of second transmission lines 32. The first transmission line 31 may be connected to the first pin 21, and the second transmission line 32 may be connected to the second pin 22. The second transmission line 32 and the second pin 22 may be disposed on different film layers, and at least one insulation layer may be disposed between the second transmission line 32 and the second pin 22. The second transmission line 32 may be connected to the second pin 22 by a transition/transfer mode. Thus, the flexible circuit board may not only be electrically connected to the first pin to transmit electrical signals to the display panel through a transmission path formed by the first pin and the first transmission line, but also connected to the second pin to transmit the electrical signal to the display panel through a transmission path formed by the second pin and the second transmission line. Accordingly, the means for transmitting electrical signals to the display panel may be increased.

In particular, the first transmission lines 31 and the second transmission lines 32 may be used to transmit display signals. The display signals may include at least one of data signals, high-level power source signals, low-level power source signals, reference potential signals, clock signals, constant high-level signals, constant low-level signals, and initial scanning signals, etc.

Figure 5:
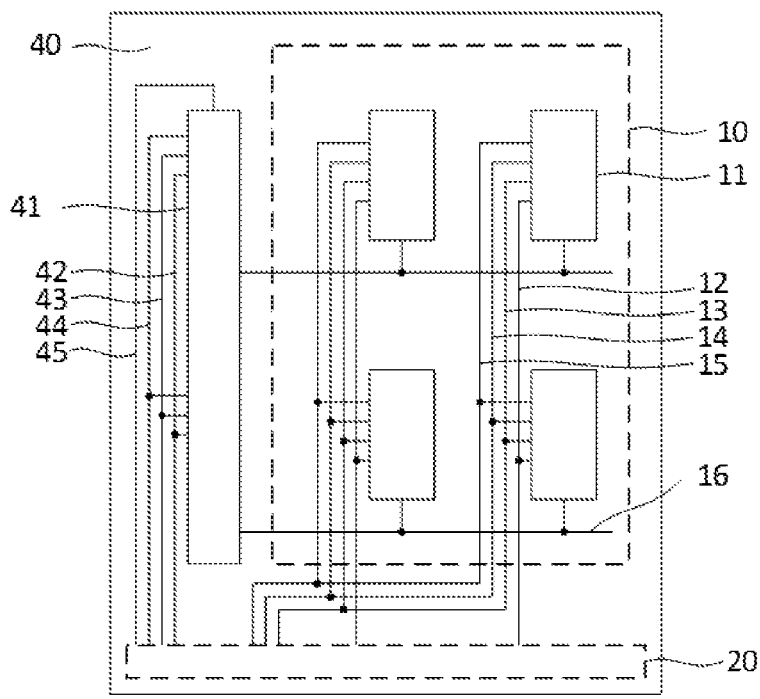
FIG. 5 illustrates an exemplary wiring diagram of an exemplary display panel consistent with various disclosed embodiments.

FIG. 5 illustrates an exemplary wiring diagram of an exemplary display panel consistent with various disclosed embodiments. As shown in FIG. 5, the display panel may include a display region 10, a non-display region 40 and a bonding region 20. The display region 10 may include a plurality of pixel circuits 11 disposed correspondingly to a plurality of pixels. The pixel circuit 11 may provide a drive current to a light-emitting element in the corresponding pixel. In the display region 10 of the display panel, a data signal line 12, a high-level power source signal line 13, a low-level power source signal line 14, a reference potential signal line 15, and a scanning signal line 16 may be respectively electrically connected to the pixel circuit 11 to provide a data signal, a high-level power source signal, a low-level power source signal, a reference potential signal, and a scanning signal, respectively. The pixel circuits and the signal lines connected to the pixel circuits may be any appropriate existing pixel circuit structures and signal lines.

The non-display region 40 may include a scanning drive circuit 41. The scanning circuit 41 may include a plurality of cascaded shift registers. The shift registers may be disposed according to the corresponding positions of corresponding pixels of the rows of the pixel circuit array, and provide scanning signals for the pixel circuits 11 through the scanning signal lines 16. In the non-display region 40 of the display panel, a clock signal line 42, a constant high-level line 43 and a constant low-level line 44 may respectively connected to the shift registers, thereby respectively providing a clock signal, a constant high-level signal, a constant low-level signal to the shift registers. Further, a scanning staring signal line 45 may be electrically connected to a first level shift register in the plurality of cascaded shift registers to provide a scanning starting signal to the scanning drive circuit 41.

The types of the signal lines shown in FIG. 5 are for illustrative purpose only, which is not intended to limit the scope of the present disclosure. The specific layout of various kinds of signal lines are not limited by the present disclosure.

In one embodiment, referring to FIG. 1, a distance between the first pin 21 and the display region 10 may be equal to a distance between the second pin 22 and the display region 10. Thus, the size of the frame/border of the display panel may be reduced. In another embodiment, the distance between the first pin 21 and the display region 10 may be different from the distance between the second pin 22 and the display region 10. A corresponding structure is shown in FIG. 6.

Figure 6:
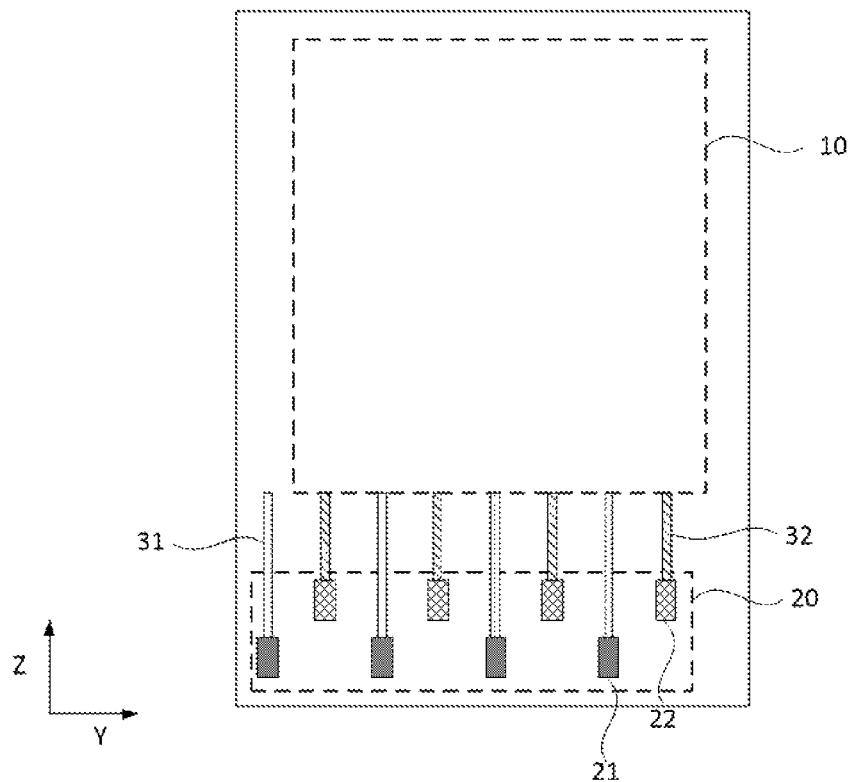
FIG. 6 illustrates another exemplary display panel consistent with various disclosed embodiments.

FIG. 6 illustrates another exemplary display panel consistent with various disclosed embodiments. As shown in FIG. 6, the distance between the first pin 21 and the display region 10 may be different from the distance between the second pin 22 and the display region 10. The first pin 21 may have a first side adjacent to the display region 10 and an opposing second side far away from the display region 10. The second pin 22 may be located at the first side of the first pin 21. Thus, the interference between the first pin 21 and the second pin 22 during the wiring layout design and the bonding process may be reduced.

Certain exemplary connection methods of the second transmission line 32 and the second pin 22 will be illustrated below.

An exemplary connection method of the second transmission line 32 and the second pin 22 may be referred to FIG. 4. As shown in FIG. 4, the second transmission line 32 may be connected to the second pin 22 through a through-hole/via 33. The through-hole 33 may be formed by selectively removing a portion of a layer located between the layer where the second transmission line 32 is located and the layer where the second pin 22 is located. Based on the through-hole 33, an electric connection between the second transmission line 32 and the second pin 22 respectively disposed on different layers may be formed.

Figure 7:
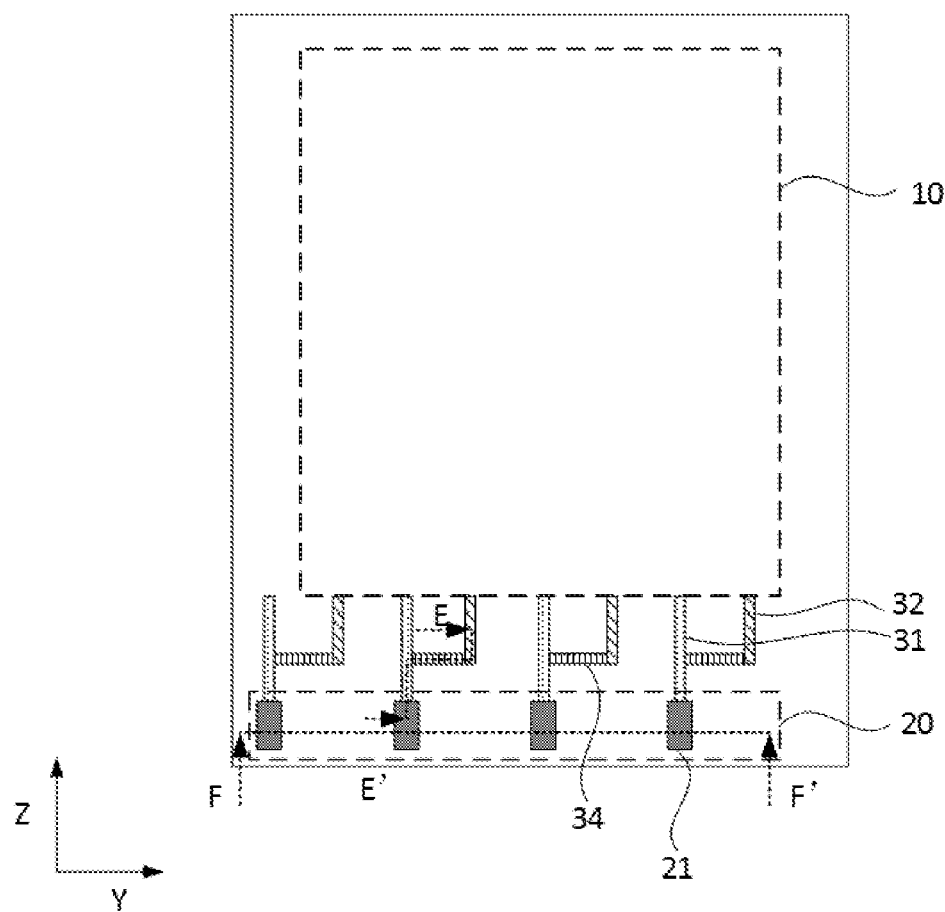
FIG. 7 illustrates another exemplary display panel consistent with various disclosed embodiments.
Figure 8:
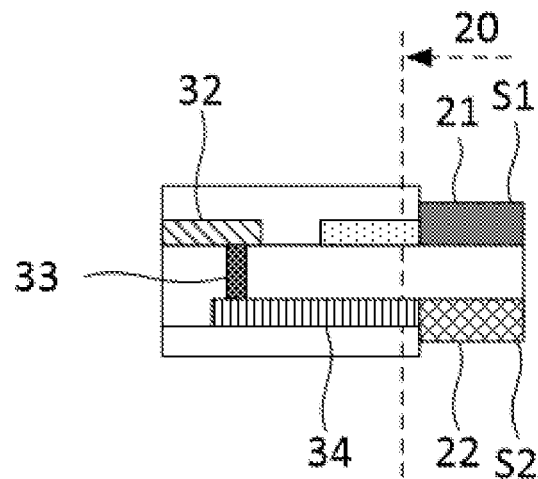
FIG. 8 illustrates an EE'-sectional view of another exemplary display panel in FIG. 7.

Another exemplary connection method of a second transmission line and a second pin may be referred to FIG. 7 and FIG. 8. FIG. 7 illustrates another exemplary display panel consistent with various disclosed embodiments. FIG. 8 is an EE'-sectional view of another exemplary display panel in FIG. 7.

As shown in FIG. 7 and FIG. 8, the display panel may include a display region 10 and a bonding region 20. The bonding region 20 may be configured to bond a flexible circuit board with the display panel. The bonding region 20 may include a first surface S1 and an opposing second surface S2. The first surface S1 may be located at the displaying side of the display panel. The bonding region 20 may include a plurality of first pins 21 and a plurality of second pins 22. The plurality of first pins 21 may be disposed on the first surface S1, and the plurality of second pins 22 may be disposed on the second surface S2.

Further, the display panel may include a plurality of first transmission lines 31 and a plurality of second transmission lines 32. A first transmission line 31 may be connected to a corresponding first pin 21, and a second transmission line 32 may be connected to a corresponding second pin 22. The plurality of first transmission lines 31 and the plurality of second transmission lines 32 may transmit display signals. The second transmission line 32 and the second pin 22 may be disposed at different film layers.

Further, the display panel may include a plurality of third transmission lines 34. The plurality of third transmission linens 34 and the plurality of second pins 22 may be disposed on a same film layer, and the plurality of third transmission lines 34 may be connected to the plurality of second pins 22. A second transmission line 32 may be connected to a third transmission line 34 through a through-hole/via 33. That is, the second transmission line 32 may be electrically connected to the second pin 22 through the third transmission line 34.

Through disposing the third transmission lines 34, a buffering effect may be realized between the second pins 22 and the through holes 33, such that the effect of the bonding process on the electrical connection between the second pins 22 and the through-hole 33 may be reduced. On the other hand, the position of the second pins 22 may be more flexibly selected. Accordingly, the positions of the second pins 22 may be selected according to various application scenarios, to form the electrical connections between the second pins and the second transmission lines via the third transmission lines.

Figure 9:
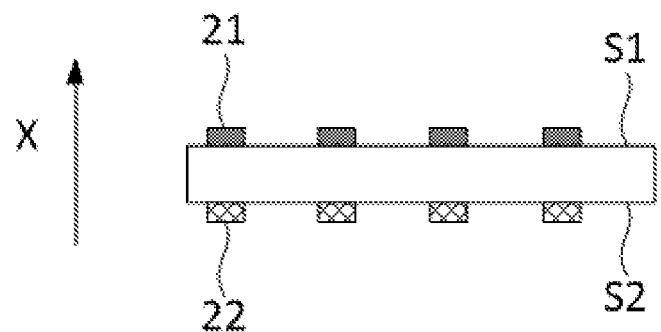
FIG. 9 illustrates an FF'-sectional view of another exemplary display panel in FIG. 7.

In another embodiment, at least one first pin may be disposed to overlap with at least one second pin. FIG. 9 illustrates an FF'-sectional view of another exemplary display panel in FIG. 7.

As shown in FIG. 7-FIG. 9, a first pin 21 may be disposed on the first surface S1, and a second pin 22 may be disposed on the second surface S2. The first pin 21 may be electrically connected to a first transmission line 31, and the second pin 22 may be electrically connected to a second transmission line 32. Along a direction X, the first pin 21 may overlap with the second pin 22. In particular, one first pin 21 may be disposed to overlap with one second pin 22. The direction X may be perpendicular to a plane where the display panel is located.

Through disposing the first pin 21 to overlap with the second pin 22, along the X direction, every pressure point on the first surface S1 (the positions where the pins 21 are located) may be overlap with every pressure point on the second surface S2 (the positions where the second pins 22 are located) during the bonding process. Compared to the approach that the first pin and the second pin are disposed alternately, through disposing the first pin 21 to overlap the second pin 22, the flatness of the bonding surface may be remained and a wavy deformation on the bonding surface caused by non-uniform force may be avoided. Accordingly, the bonding accuracy may be improved, and a desired electrical connection may be formed between the pins and the flexible circuit board. Further, disposing the third transmission lines may facilitate the position adjustment of the second pins so as to allow the second pins to overlap with the first pins.

Certain exemplary arrangement of the first transmission lines 31 and the second transmission lines 32 will be illustrated below.

In one embodiment, the first transmission lines 31 and the second transmission lines 32 may be disposed at a same film layer. Through disposing the first transmission lines and the second transmission lines in the same film layer, the first transmission lines and the second transmission lines may be formed by a same process. Thus, the fabrication process may be simplified, and the production cost may be reduced. The corresponding structure is shown in FIGS. 10-11.

Figure 10:
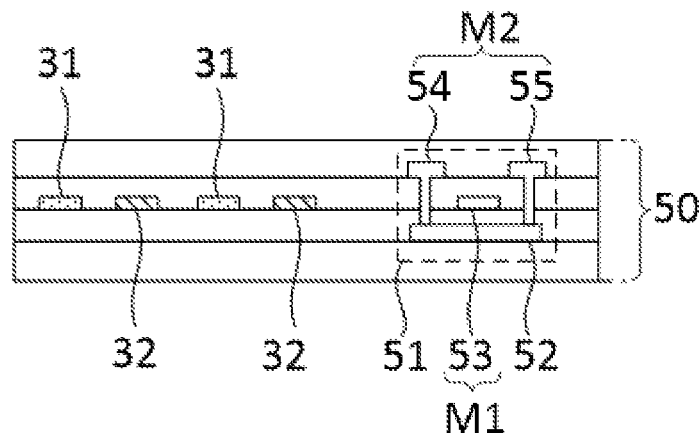
FIG. 10 illustrates another DD'-sectional view of an exemplary display panel in FIG. 1.

FIG. 10 illustrates a DD'-sectional view of another exemplary display panel in FIG. 1. FIG. 11 illustrates another DD'-sectional view of another exemplary display panel in FIG. 1.

Figure 11:
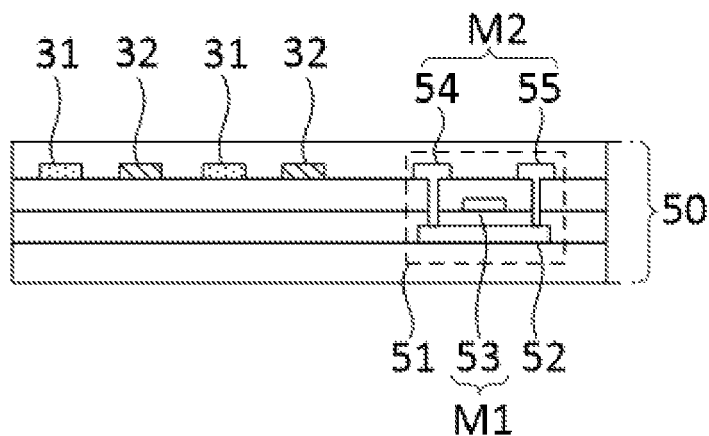
FIG. 11 illustrates another DD'-sectional view of an exemplary display panel in FIG. 1.

As shown in FIG. 10 and FIG. 11, the display panel may also include a thin-film transistor (TFT) array layer (or substrate) 50. The TFT array layer 50 may include a plurality of thin-film transistors (TFTs). A TFT may include an active layer 52, a gate 53, a source 54 and a drain 55. The gate 53 may be disposed at a first metal layer M1. The source 54 and the drain 55 may be disposed at a second metal layer M2.

In one embodiment, as shown in FIG. 10, the first transmission lines 31 and the second transmission lines 32 may be both disposed at the first metal layer M1. In another embodiment, as shown in FIG. 11, the first transmission lines 31 and the second transmission lines 32 may be all disposed at the second metal layer M2.

Referring to FIG. 10, in one embodiment, the first transmission lines 31, the second transmission lines 32 and the gate 53 may all be disposed at the first metal layer M1. That is, the first transmission lines 31, the second transmission lines 32 and the gate 53 may be formed from the first metal layer M1 by a same fabrication process.

Referring to FIG. 11, in another embodiment, the first transmission lines 31, the second transmission lines 32, the source 54 and the drain 55 may all be disposed at the second metal layer M2. That is, the first transmission lines 31, the second transmission lines 32, the source 54 and the drain 55 may be formed from the second metal layer M2 by a same fabrication process.

Further, referring to FIG. 5, the TFTs 51 of the TFT array layer 50 may form pixel circuits 11. Through utilizing the switching characteristics of the TFTs, the function of the pixel circuits may be achieved. In particular, under the control of the gate 53, the TFT 51 may turn on or turn off the electrical connection between the source 54 and the drain 55.

In another embodiment, the first transmission lines and the second transmission lines may be disposed at different film layers. The corresponding structure is shown in FIG. 12.

Figure 12:
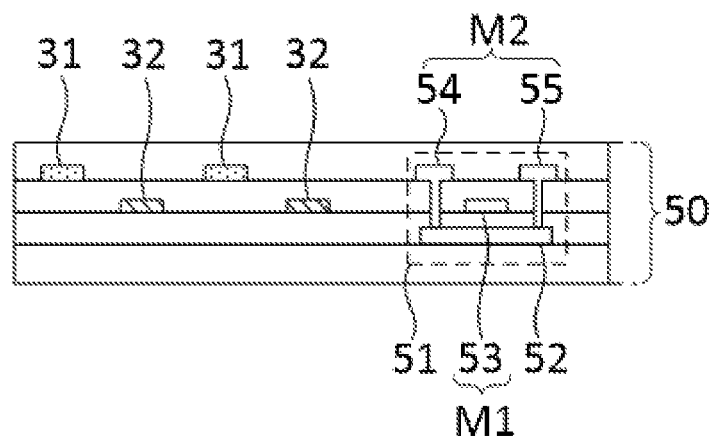
FIG. 12 illustrates another DD'-sectional view of exemplary display panel in FIG. 1.

FIG. 12 illustrates an exemplary DD'-sectional view of another exemplary display panel consistent with various disclosed embodiments.

As shown in FIG. 12, the first transmission line 31, the source 54 and the drain 55 may be formed from the second metal layer M2 by a same fabrication process, and the second transmission line 32 and the gate 53 may be formed from the first metal layer M1 by a same fabrication process. In another embodiment, the first transmission line 31 and the gate 53 may be formed from the first metal layer M1 by a same fabrication process, and the second transmission line 32, the source 54 and the drain 55 may be formed from the second metal layer M2 by a same fabrication process The first transmission line may be disposed at one of the first metal layer and the second metal layer, and the second transmission line may be disposed at another of the first metal layer and the second metal layer. For example, as shown in FIG. 12, the first transmission line 31 may disposed at the second metal layer M2, and the second transmission line 32 may be disposed at the first metal layer M1. Accordingly, the gap between the first transmission line 31 and the second transmission line 32 may be increased, and the crosstalk between the first transmission line 31 and the second transmission line 32 may be reduced. Further, the gap between the second transmission line 32 and the second pin may be substantially small. Thus, it may be easy to form the through hole connecting to both the second transmission line and the second pin, and a desired electrical connection between the second transmission line 32 and the second pin may be formed.

As shown in FIG. 10-FIG. 12, for illustrative purposes, top-gate TFTs are described. The types of the TFTs are not limited by the present disclosure. For example, the TFTs may be bottom-gate TFTs.

In certain embodiments, along a first direction, the first transmission lines and the second transmission lines may be alternately distributed. In one embodiment, the first direction may be perpendicular to a distribution direction of the display region and the bonding region. Referring to FIG. 1, FIG. 6, FIG. 7, FIG. 10, FIG. 11 and FIG. 12, the display region 10 and the bonding region 20 may be distributed along a Z direction. The first direction Y may be perpendicular to the Z direction. Along the first direction Y, the first transmission lines 31 and the second transmission lines 32 may be alternately distributed. Correspondingly, along the first direction Y, the first pins and the second pins may also be alternately distributed. Accordingly, all the first pins may be uniformly distributed at the first surface, and all the second pins may be uniformly distributed at the second surface. Therefore, a bonding between the display panel and the flexible circuit board may be easy to achieve. The first transmission lines and the second transmission lines may also be distributed as sectors. That is, when the first transmission lines and the second transmission lines extend from the display region to the bonding region, the first transmission lines and the second transmission lines may become nearer. Accordingly, the area of the bonding region may be reduced.

In one embodiment, the thickness of the first pin and the thickness of the second pin may be the same as the thickness of the transmission line connected to the corresponding pin.

In another embodiment, the disclosed display panel may also include a foldable region. The foldable region may be disposed between the display region and the bonding region. The display panel may have a third surface and an opposing fourth surface. The third surface of the display panel may be the displaying surface of the display panel. The fourth surface may have a first side facing the third surface and an opposing second side far away from the third surface. The portion of the display panel in the foldable region may be folded to allow the bonding region to be located at the second side of the fourth surface.

In the disclosed embodiments, an integrated circuit (IC) chip may be disposed between the first transmission lines and the display region, and between the second transmission lines and the display region. The first transmission lines and the second transmission lines may be connected to the input terminals of the IC chip. The transmission lines from the display region and the transmission lines disposed in the peripheral regions of the display panel may be connected to the output terminals of the IC chip to receive the signals output from the IC chip.

Figure 13:
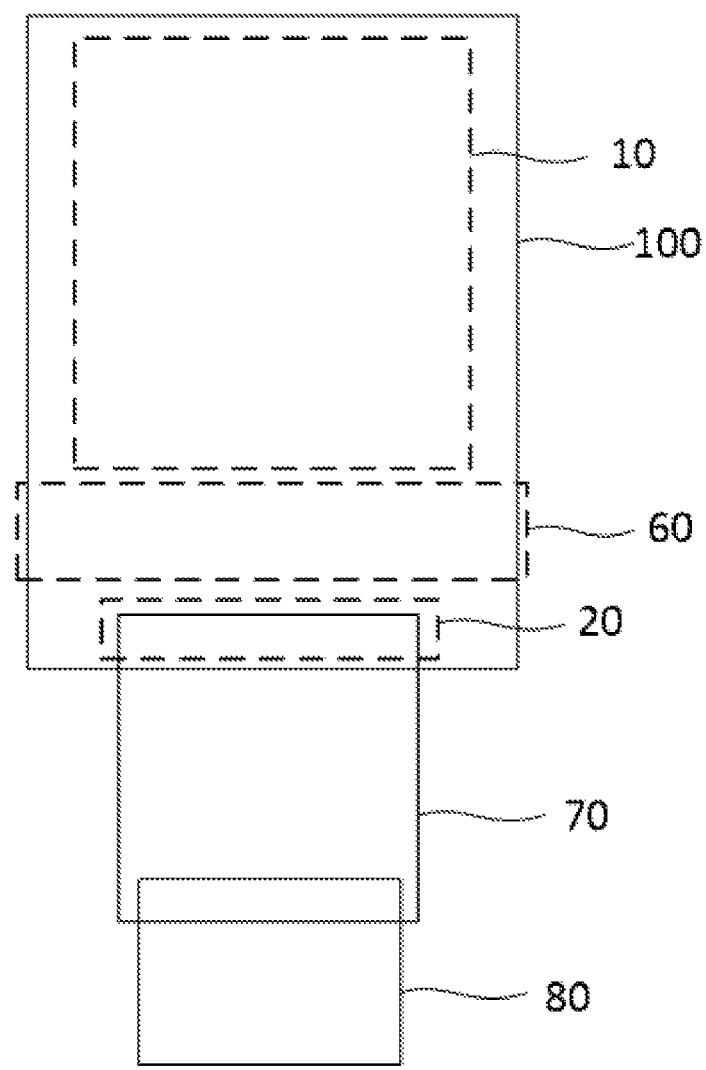
FIG. 13 illustrates a top view of another exemplary display panel consistent with various disclosed embodiments.
Figure 14:
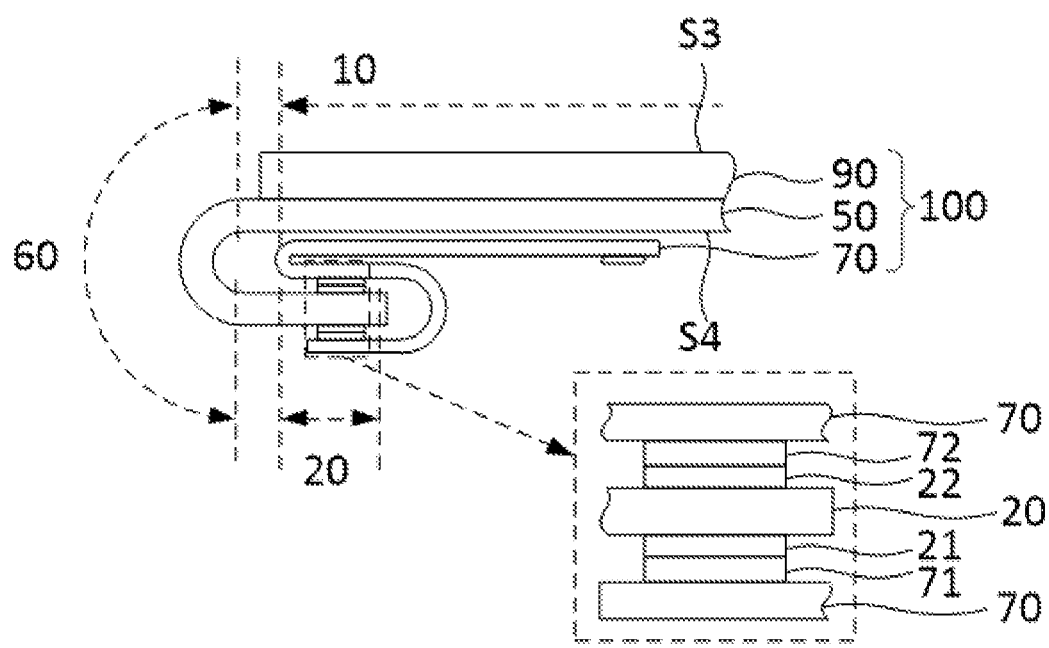
FIG. 14 illustrates a cross-sectional view of an exemplary folded display panel consistent with various disclosed embodiments.

FIG. 13 illustrates a top view of another exemplary display panel consistent with various disclosed embodiments. FIG. 14 illustrates a cross-sectional of an exemplary folded display panel in FIG. 13 consistent with various disclosed embodiments.

As shown in FIG. 13 and FIG. 14, the display panel 100 may include the display region 10, the bonding region 20, a flexible circuit board 70, and a main circuit board 80.

Further, the display panel 100 may also include a foldable region 60. The foldable region 60 may be disposed between the display region 10 and the bonding region 20. The display panel 100 may have a third surface S3 and an opposing fourth surface S4. The third surface S3 of the display panel 100 may be the displaying surface of the display panel. The fourth surface S4 may have a first side facing the third surface S3 and an opposing second side far away from the third surface S3. The portion of the display panel 100 in the foldable region 60 may be folded to allow the bonding region 20 to be located at the second side of the fourth surface S4.

Through disposing the foldable region 60, the size of the frame of the display panel 100 may be reduced. The display panel 100 may include a flexible substrate to allow the display panel 100 to be flexible to achieve a bending of the display panel 100. Because the bonding region 20 of the display panel 100 may occupy a certain area of the frame, the size of the frame of the display panel 100 may not be easily reduced. In one embodiment, the foldable region 60 may be disposed on the display panel 100. The bonding region 60 may be folded to the second side of the fourth surface S4 of the display panel 100. Thus, the size of the frame of the display panel 100 may be reduced. The flexible substrate may be made of a flexible material, such as polyimide, etc.

Further, the display panel 100 may include the TFT array layer 50 and the organic light-emitting element layer 90 disposed on the TFT array layer 50. The organic light-emitting element layer 90 may include a plurality of organic light-emitting elements emitting light. In FIG. 14, the display panel 100 may be a top-emitting display panel. The organic light-emitting element layer 90 may have a first surface facing the TFT array layer 50 and an opposing second surface far away from the TFT array layer 50. The second surface of the organic light-emitting device layer 90 may be the displaying surface.

In another embodiment, the TFT array layer may have a first surface facing the organic light-emitting element layer and an opposing second surface far away from the organic light emitting element layer. When the display panel is a bottom-emitting display panel, the second side of the TFT array layer may be the display surface. Accordingly, the design of certain structures of the display panel may be correspondingly adjusted to form the display panel, and the display panel is still within the scope of the present disclosure.

The thickness of the display panel may be substantially small, through the foldable region, the bonding region may be folded to the second side of the fourth surface, the radius of curvature of the foldable region may be often substantially small. Thus, the folded portion of the foldable region may have a relatively large stress, and may have certain impacts onto the structures inside the display panel, and even fail the function of the display panel. Through selectively removing a portion of the film layer in the foldable region, the stress of the foldable region when being folded may be reduced, and the display apparatus may have a desired foldable performance.

Referring to FIG. 13, one end of the flexible circuit board 70 may be bonded to the display panel 100, and the other end of the flexible circuit board 70 may be bonded to the main circuit board 80. The flexible circuit board 70 may transmit electrical signals between the display panel 100 and the main circuit board 80.

Referring to FIG. 14, the display panel 100 may be bonded to the flexible circuit board 70 to form an electrical connection between the display panel 100 and the flexible circuit board 70, and electrical signals may be provided to the display panel 100 through the flexible circuit board 70. In one embodiment, the flexible circuit board 70 may include a first golden finger 71 and a second golden finger 72. The first golden finger 71 and the second golden finger 72 may be configured as the output terminals of the flexible circuit board 70. The first golden finger 71 may be electrically connected to a first pin 21, and the second golden finger 72 may be electrically connected to a second pin 22. To achieve a precise electrical signal output, the number and the wiring scenario of the first golden fingers 71 may correspond to the first pins 21 of the display panel 100, and the number and the wiring scenario of the second golden fingers 72 may correspond to the second pins 22 of the display panel 100.

The first golden finger and the second golden finger may be disposed on the flexible circuit board with any appropriate wiring scenario. Certain arrangement of the first golden finger and the second golden finger will be illustrated below.

Figure 15:
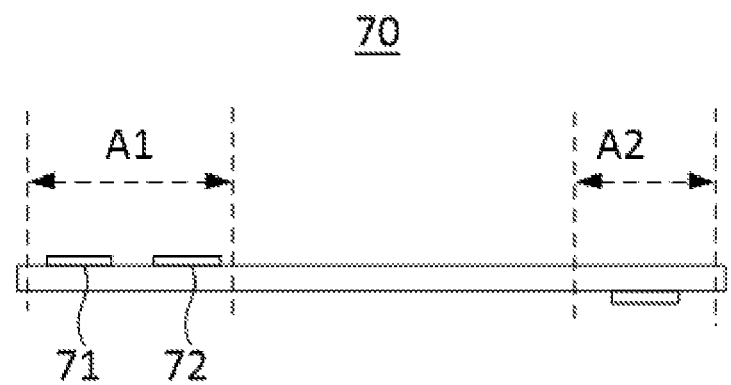
FIG. 15 illustrates a cross-sectional view of an exemplary flexible circuit board consistent with various disclosed embodiments.
Figure 16:
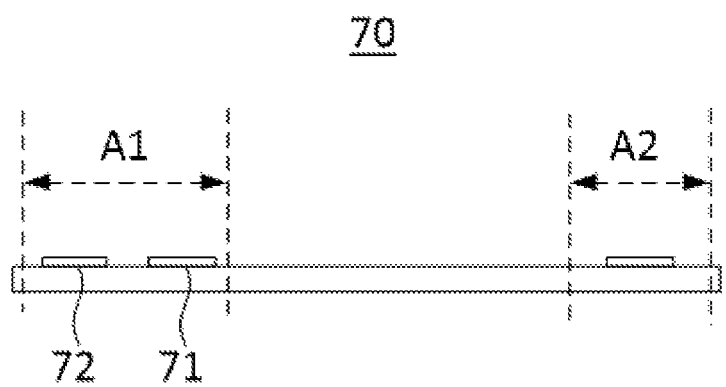
FIG. 16 illustrates a cross-sectional view of another exemplary flexible circuit board consistent with various disclosed embodiments.
Figure 17:
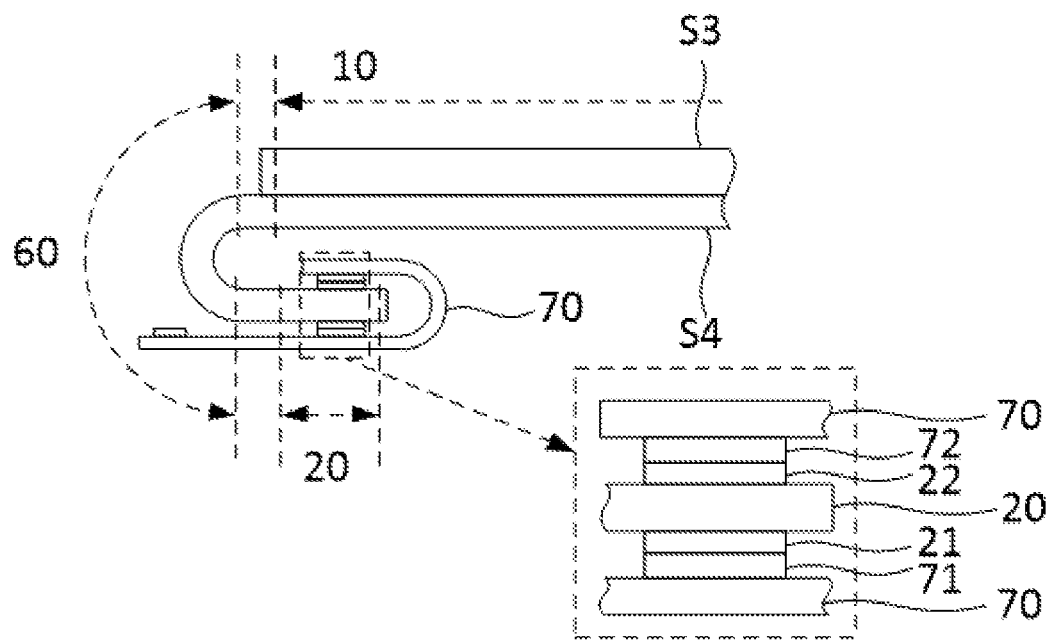
FIG. 17 illustrates a cross-sectional view of another exemplary display panel consistent with various disclosed embodiments.

In one embodiment, the first golden finger and the second golden finger may be disposed at a same side of the flexible display panel. FIG. 14-FIG. 17 illustrate corresponding structures. FIG. 15 illustrates a cross-sectional view of an exemplary flexible circuit board consistent with various disclosed embodiments. FIG. 16 illustrates a cross-sectional of another exemplary flexible circuit board consistent with various disclosed embodiments. FIG. 17 illustrates a cross-sectional view of another exemplary display panel consistent with various disclosed embodiments.

As shown in FIG. 14-FIG. 17, the flexible circuit board 70 may be folded for approximately 180° to form an electrical connection between the first golden finger 71 and the first pin 21 and an electrical connection between the second golden finger 72 and the second pin 22. Because the first golden finger 71 and the second golden finger 72 may be disposed at the same side of the flexible circuit board 70, the first golden finger 71 and the second golden finger 72 may be formed by a same process. Thus, the fabrication steps and the production cost may be reduced.

In one embodiment, the flexible circuit board 70 may have a first region and a second region. The first golden finger and the second golden finger may be disposed at the first region, and the second region may bond to a main circuit board. In particular, as shown in FIG. 14 and the FIG. 15, the flexible circuit board 70 may include a first region A1 and a second region A2. The first region A1 may bond to a display panel, and the second region A2 may bond to the main circuit board. The first golden finger 71 and the second golden finger 72 may be disposed at the first region A1. The first golden finger 71 may have a first side adjacent to the second region A2 and an opposing second side far away from the second region A2. The second golden finger 72 may be disposed at the first side of the first golden finger 71. Thus, as shown in FIG. 14, after bonding the flexible circuit 70 to the display panel 100, the flexible circuit board 70 may be located between the display region 10 and the bonding region 20 of the display panel 100, and the flexible circuit board 70 and the display panel 100 may have a desired electrical connection, and space may be saved.

In another embodiment, the second gold finger may be disposed at the second side of the first golden finger. In particular, as shown in FIG. 16 and the FIG. 17, the flexible circuit board 70 may include a first region A1 and a second region A2. The first region A1 may bond to a display panel, and the second region A2 may bond to a main circuit board. The first golden finger 71 and the second golden finger 72 may be disposed at the first region A1. The first golden finger 71 may have a first side adjacent to the second region A2 and an opposing second side far away from the second region A2. The second golden finger 72 may be disposed at the second side of the first golden finger 71. In the disclosed embodiments, the second golden finger 72 may be bonded to the second pin 22 first. Then, the first golden finger 71 may be bonded to the first pin 21. Thus, the bonding between the flexible circuit board 70 and the displayer panel 100 may be easy to realize.

In one embodiment, as shown in FIG. 15, a golden finger in the second bonding region A2 and bonding with a main circuit board (not shown) may be disposed at the same side of the flexible circuit 70 as the first golden finger 71 and the second golden finger 72. In another embodiment, as shown in FIG. 16, the golden finger in the second bonding region A2 and bonding with the main circuit board (not shown) may be disposed at a different side of the flexible circuit 70 from the first golden finger 71 and the second golden finger 72.

In another embodiment, the flexible circuit board may include a main body, a first branch member and a second branch member. The first branch member and the second branch member may be connected to a same side of the main body, and the first branch member and the second branch member may be stacked together. In another embodiment, the first branch member and the second branch member may not connect to each other. The first golden finger may be disposed on the first branch member. The first branch member may have a first side adjacent to the second branch member and an opposing second side far away from the second branch member. The first golden finger may be disposed at the first side of the first branch member. The second golden finger may be disposed on the second branch member. The second branch member may have a first side adjacent to the first branch member and an opposing second side far away from the first branch member. The second golden finger may be disposed at the first side of the second branch member. FIG. 18-FIG. 23 illustrate a corresponding structures.

Figure 18:
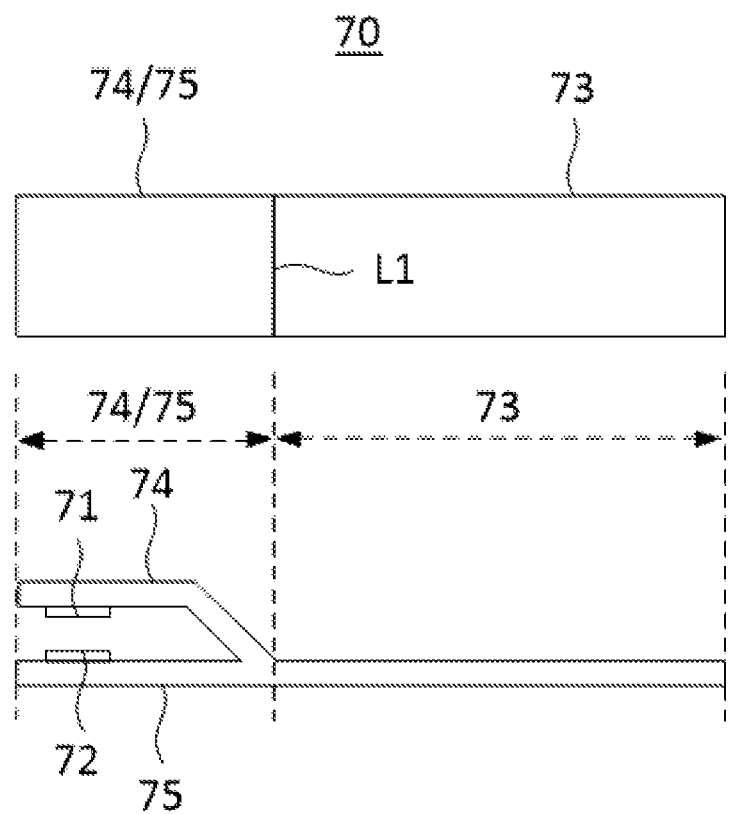
FIG. 18 illustrates a top view and a cross-sectional view of an exemplary flexible circuit board consistent with various disclosed embodiments.
Figure 19:
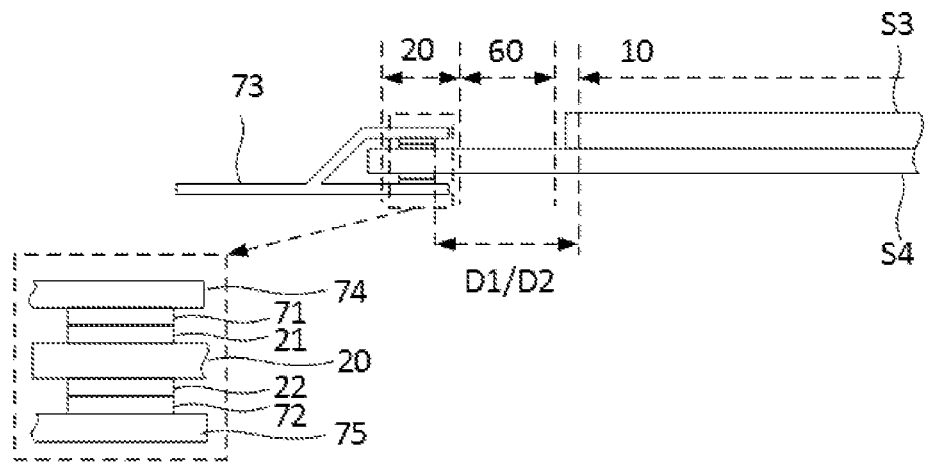
FIG. 19 illustrates a cross-sectional view of another exemplary display panel consistent with various disclosed embodiments.
Figure 20:
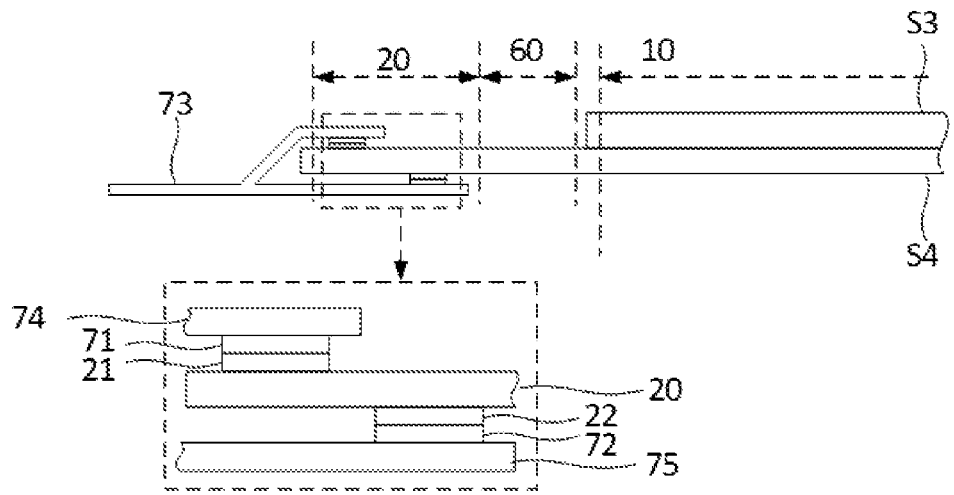
FIG. 20 illustrates a cross-sectional view of another exemplary display panel consistent with various disclosed embodiments.
Figure 23:
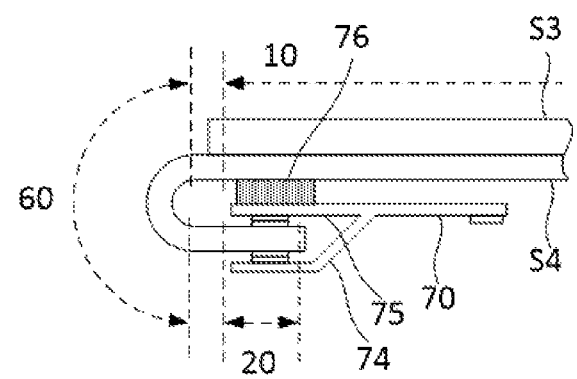
FIG. 23 illustrates a cross-sectional view of another exemplary display panel consistent with various disclosed embodiments.

FIG. 18 illustrates a cross-sectional view and a top view of an exemplary flexible circuit board consistent with various disclosed embodiments. The top portion of FIG. 18 illustrates a top view of an exemplary flexible circuit board consistent with various disclosed embodiments, and the bottom portion of FIG. 18 illustrates a cross-sectional view of an exemplary flexible circuit board consistent with various disclosed embodiments. FIG. 19 illustrates a cross-sectional view of another exemplary display panel consistent with various disclosed embodiments. FIG. 20 illustrates a cross-sectional view of another exemplary display panel consistent with various disclosed embodiments. FIG. 23 illustrates a cross-sectional view of another exemplary display panel consistent with various disclosed embodiments.

As shown in FIG. 18-FIG. 20 and FIG. 23, the flexible circuit board 70 may include a main body 73, a first branch member 74 and a second branch member 75. The first branch member 74 and the second branch member 75 may be connected to a same side of the main body 73.

For example, as shown in FIG. 18, the side L1 is the same side of the main body 73 to which the first branch member 74 and the second branch member 75 may be connected. The first branch member 74 and the second branch member 75 may be stacked together. The first golden finger 71 may be disposed at the first branch member 74. The first branch member 74 may have a first side adjacent to the second branch member 75 and an opposing second side far away from the second branch member 75. The first golden finger 71 may be disposed at the first side of the first branch member 74. The second golden finger 72 may be disposed at the second branch member 75. The second branch member 75 may have a first side adjacent to the first branch member 74 and an opposing second side far away from the first branch member 74. The second golden finger 72 may be disposed at the first side of the second branch member 75.

On one hand, when the flexible circuit board 70 is bonded to a display panel (not shown), the bonding region of the display panel may be located between the first branch member 74 and the second branch number 75 of the flexible circuit board 70. Thus, without a bending, an electrical connection between the first golden finger 71 of the flexible circuit board 70 and the first pin of the display panel may be formed, and an electrical connection between the second golden finger 72 of the flexible circuit board 70 and the second pin of the display panel may be formed. Further, the bonding difficulty between the flexible circuit board 70 and the display panel may be reduced.

At the same time, because the portion of the flexible circuit board 70 between the first golden finger 71 and the second golden finger 72 may not be bent, the portion of the flexible circuit board 70 between the first golden finger 71 and the second golden finger 72 may not generate extra stress, and a reliable electrical connection between the flexible circuit 70 and the display panel may be formed. On the other hand, when the display panel is folded, when the bonding region is disposed at the second side of the fourth surface of the display panel, the flexible circuit board 70 may have a desired surface connection with the fourth surface of the display panel without generating an extra folding. Thus, the flexible circuit board 70 may be well protected, and the damage to the flexible circuit board 70 may be reduced.

Further, as shown in FIG. 19, a distance between the first pin 21 and the display region 10 may be a first distance D1, a distance between the second pin 22 and the display region 10 may be a second distance D2, and the first distance D1 may be equal to the second distance D2. In one embodiment, along a direction perpendicular to the display panel, the first pin 21 and the second pin 22 may be stacked together. When bonding the flexible circuit board with a display panel, along the direction perpendicular to display panel, the force received by the bonding region may be balanced. Thus, the wavy deformation on the bonding region of the display panel caused by an unbalanced force may be avoided, and the bonding accuracy and the reliability of the electrical connection may be improved.

In one embodiment, the first distance D1 and the second distance D2 may be different. As shown in FIG. 20, along the direction perpendicular to the display panel, the first pin 21 and the second pin 22 may not overlap with each other. The first pin 21 may have a first side adjacent to the display region 10 and a second side far away from the display region 10. The second pin 22 may be disposed at the first side of the first pin 21. Thus, the interference between the first pin 21 and the second pin 22 during the layout design and the bonding process may be reduced.

Figure 21:
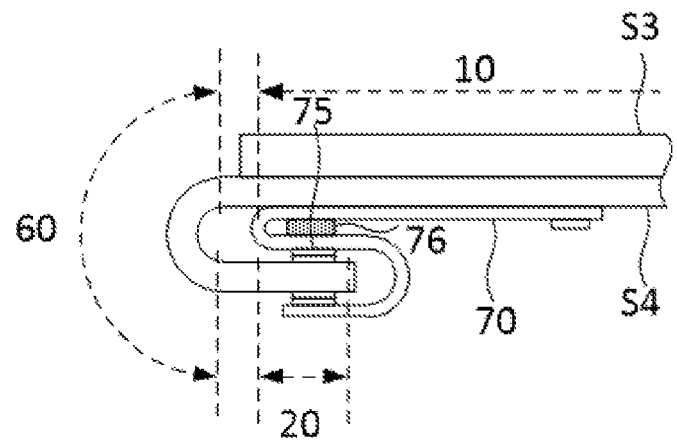
FIG. 21 illustrates a cross-sectional view of another exemplary display panel consistent with various disclosed embodiments.
Figure 22:
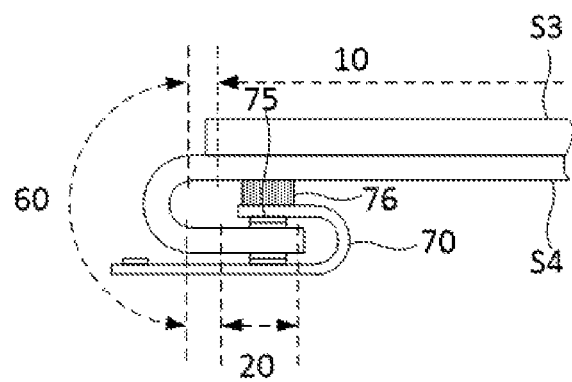
FIG. 22 illustrates a cross-sectional view of another exemplary display panel consistent with various disclosed embodiments.

In another embodiment, the flexible circuit board may also include a supporting layer. FIG. 21 and FIG. 22 illustrate corresponding structures.

FIG. 21 illustrates a cross-sectional view of another example display panel consistent with various disclosed embodiments. FIG. 22 illustrates a cross-sectional view of another example display panel consistent with various disclosed embodiments.

As shown in FIG. 21 and FIG. 22, the flexible circuit board 70 may also include a supporting layer 76. The supporting layer 76 and the second golden finger 72 may be disposed at two different sides of the flexible circuit board 70. For example, the flexible circuit board 70 may include a first side and an opposing second side. When the second golden finger 72 is disposed on the first side of the flexible circuit board 70, the supporting layer 76 may be disposed on the second side of the flexible circuit board 70. Through folding the display panel, the supporting layer 76 may be disposed between the bonding region 20 and the display region 10 of the display panel. Further, the supporting layer 76, the bonding region 20 and the display region 10 may be disposed in stacked. Thus, the supporting layer 76 may be disposed between the bonding region 20 and the display region 10 of the display panel to have a supporting function to prevent the display panel from over-folding, i.e., the radius of curvature of the foldable region 60 is substantially small. Thus, the foldable region 60 may be protected.

Further, as shown in FIG. 21, along a sequence from the first region to the second region of the flexible circuit board 70, the first golden finger (not labeled) may be electrically connected to the first pin (not labeled) first, the flexible circuit board 70 may be then folded for approximately 180° to allow to the second golden finger 72 to be electrically connected to the second pin. Then, the flexible circuit board 70 may be folded for approximately 180° again to cause the flexible circuit board 70 to extend along a direction away from the foldable region 60, and connect to the fourth surface S4 of the display panel. Thus, the flexible circuit board 70 may be S-shaped, and the supporting layer 76 may be wrapped by the folded flexible circuit board 70. When supporting the flexible circuit board 70, the supporting layer 76 may also support the display panel. Thus, the over-folding of the flexible circuit board 70 and the display panel may be avoided. That is, the radius of curvature of the folded portion of the flexible circuit board 70 and the radius of curvature of the foldable region 60 of the display panel may be not be substantially small. Thus, the folded portion of the flexible circuit board 70 and the foldable region 60 of the display panel may be protected.

In FIG. 21, the relative position between the folded portion of the flexible circuit board 70 and the foldable region 60 of the display panel is for illustrative purposes only and, is not intended to limit the scope of the present disclosure. In practical applications, the relative position between the folded portion of the flexible circuit board and the foldable region of the display panel may be determined according to various application scenarios. For example, the folded portion of the flexible circuit board may also contact with the foldable region of the display panel.

In another embodiment, the flexible circuit board may include a main body, a first branch member, and a second branch number. The corresponding structures may be referred to the previous described embodiments and FIG. 18-FIG. 20 and FIG. 23.

As shown in FIG. 18-FIG. 20 and FIG. 23, the flexible circuit board 70 may also include a supporting layer 76. The second branch member 75 may have a first side adjacent to the first branch member 74 and a second side far away from the first branch member 74. The supporting layer 76 may be disposed at the second side of the second branch member 75, and the supporting layer 76 and the bonding region 20 may be correspondingly disposed. In one embodiment, the supporting layer 76 is disposed at the second side of the second branch member 75. The fourth surface S4 of the display panel may have a first side adjacent to the third surface S3 of the display panel and an opposing second side far away from the third surface of the display panel.

When the foldable region 60 of the display panel is folded, the bonding region 20 may be located at the second side of the fourth surface S4 of the display panel, and the supporting layer 76 may be located between the display region 10 and the bonding region 20. The supporting layer 76, the displayer region 10 and the bonding region 20 of the display panel may be stacked together. Thus, the supporting layer 76 may provide a supporting function between the display region 10 and the bonding region 20 to prevent the display panel from over folding, and the damage of the folding of the display panel onto the display panel may be avoided.

Figure 24:
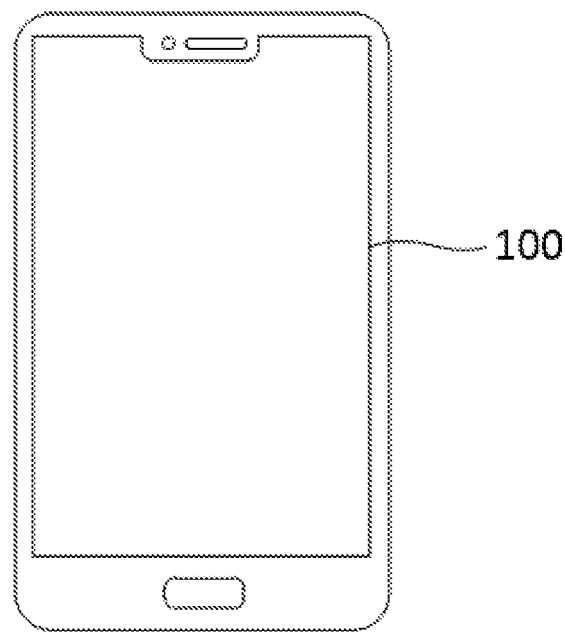
FIG. 24 illustrates an exemplary display apparatus consistent with various disclosed embodiments.

The present disclosure also provides a display apparatus capable of disposing more pins in the bonding region and, meanwhile, increasing bonding accuracy, reducing bonding difficulty and increasing yield. The display apparatus may include a disclosed display panel. FIG. 24 illustrates a corresponding display apparatus consistent with various disclosed embodiments.

As shown in FIG. 24, the display apparatus 200 may include a disclosed display panel 100. For illustrative purposes, a cell phone is illustrated in FIG. 24. In certain embodiments, the display apparatus 200 may be other display apparatus having the display function, such as a cell phone, a tablet computer, an on-board display apparatus, or a an virtual reality apparatus, etc. The disclosed display apparatus may include the disclosed display panel. Thus, the display apparatus may have the beneficial technical effects described in the display panel.

Thus, comparing with the existing technology, the disclosed display panel and display apparatus may include at least following beneficial technical effects.

In the disclosed display panel and display apparatus, the bonding region may include a first surface and an opposing second surface. First pins may be disposed at the first surface of the bonding region, and second pins may be disposed at the second surface of the bonding region. First transmission lines and second transmission lines transmitting a display signal may be connected to a flexible circuit board through the first pins and the second pins, respectively. By disposing the first pin and the second pin at different surfaces/film layers (double layer pin design), more pins may be disposed at a certain bonding width. Further, the gap between adjacent pins and the width of the pin may be increased, the bonding accuracy may be increased, and the bonding difficulty may be reduced. Accordingly, the yield of the display panel and display apparatus may be improved.

In the accompany drawings, to better view the structures, some parts may be enlarged according to certain ratio. The ratios among different parts are not intended to limit the protection scope of the present disclosure.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:
1. A display panel, comprising:
a display region;
a bonding region bonding a flexible circuit board with the display panel,
wherein the bonding region comprises a first surface located at a displaying side of the display panel and an opposing second surface,
the bonding region includes a plurality of first pins and a plurality of second pins,
the plurality of first pins are disposed at the first surface of the bonding region, and
the plurality of second pins are disposed at the second surface of the bonding region; and
a plurality of first transmission lines and a plurality of second transmission lines,
wherein a first transmission line of the plurality of first transmission lines is connected to a first pin of the plurality of first pins,
a distance between the first pin and the display region is a first distance,
a second transmission line of the plurality of second transmission lines is connected to a second pin of the plurality of second pins,
a distance between the second pin and the display region is a second distance,
the first distance is approximately equal to the second distance,
the second transmission line and the second pin are disposed on different film layers, and
the plurality of first transmission lines and the plurality of second transmission line transmit display signals.

2. The display panel according to claim 1, wherein:
the display signals include at least one of a data signal, a high-level power source signal, a low-level power source signal, a reference potential signal, a clock signal, a constant high-level signal, a constant low-level signal and a scanning starting signal.

3. The display panel according to claim 1, further comprising:
a foldable region disposed between the display region and the bonding region,
wherein:
the display panel includes a third surface and an opposing fourth surface,
the third surface is the displaying surface of the display panel,
the fourth surface has a first side adjacent the third surface and an opposing second side far away from the third surface, and
a portion of the display panel in the foldable region is folded to enable the bonding region to be disposed at the second side of the fourth surface of the display panel.

4. The display panel according to claim 1, wherein:
the second transmission line is connected to the second pin through a through hole.

5. The display panel according to claim 4, wherein:
along a first direction perpendicular to a direction from the display region to the bonding region, the first transmission lines and the second transmission lines are alternately distributed.

6. The display panel according to claim 4, further comprising:
a plurality of third transmission lines disposed at a same film layer as the second pins,
wherein a third transmission line of the plurality of third transmission lines is connected with the second pin, and the second transmission line is connected to the third transmission line through the through hole.

7. The display panel according to claim 6, wherein: at least one first pin overlaps with at least one second pin.

8. The display panel according to claim 4, wherein: the first transmission line and the second transmission line are disposed on a same film layer.

9. The display panel according to claim 8, further comprising:
a thin film transistor array layer,
wherein:
the thin film transistor array layer includes a plurality of thin film transistors,
a thin film transistor of the plurality of thin film transistors includes an active layer, a gate, a source and a drain,
the gate of the thin film transistor is disposed at a first metal layer,
the source and the drain of the thin film transistor are disposed at a second metal layer, and
the first transmission line and the second transmission line are both disposed at one of the first metal layer and the second metal layer.

10. The display panel according to claim 4, wherein: the first transmission line and the second transmission line are disposed at different film layers.

11. The display panel according to claim 10, further comprising:
a thin film transistor array layer,
wherein:
the thin film transistor array layer includes a plurality of thin film transistors,
a thin film transistor of the plurality of thin film transistors includes an active layer, a gate, a source and a drain,
the gate of the thin film transistor is disposed at a first metal layer,
the source and the drain of the thin film transistor is disposed at a second metal layer,
the first transmission line is disposed at one of the first metal layer and the second metal layer, and
the second transmission line is disposed at the other of the first metal layer and the second metal layer.

12. The display panel according to claim 1, further comprising:
a flexible circuit board comprising a first golden finger and a second golden finger,
wherein:
the first golden finger is connected to the first pin; and
the second golden finger is connected to the second pin.

13. The display panel according to claim 12, wherein: the flexible circuit board comprises a main body, a first branch member and a second branch member;
the first branch member and the second branch member are connected to a same side of the main circuit board, respectively;
the first branch member and the second branch member are stacked together;
the first branch member has a first side facing the second branch member and an opposing second side far away from the second branch member;
the first golden finger is disposed at the first side of the first branch member;
the second branch member has a first side facing the first branch member and an opposing second side far away from the first branch member; and
the second golden finger is disposed at the first side of the second branch member.

14. The display panel according to claim 13, further comprising:
a supporting layer disposed at the second side of the second branch member,
wherein the supporting layer is disposed corresponding to the bonding region of the display panel.

15. The display panel according to claim 12, wherein: the first golden finger and the second golden finger are disposed at a same side of the flexible circuit board.

16. The display panel according to claim 15, wherein: the flexible circuit board comprises a first region and a second region;
the first golden finger and the second golden finger are disposed at the first region;
the second region is bonded with a main circuit board;
the first golden finger has a first side adjacent to the second region and an opposing second side far away from the second region; and
the second golden finger is disposed at the first side of the first golden finger.

17. The display panel according to claim 15, wherein: the flexible circuit board comprises a first region and a second region;
the first golden finger and the second golden finger are disposed at the first region;
the second region is bonded with a main circuit board;
the first golden finger has a first side adjacent to the second region and an opposing second side far away from the second region; and
the second golden finger is disposed at the second side of the first golden finger.

18. A display apparatus, comprising:
a display panel,
wherein the display panel comprises:
a display region;
a bonding region bonding a flexible circuit board with the display panel,
wherein the bonding region comprises a first surface located at a displaying side of the display panel and an opposing second surface,
the bonding region includes a plurality of first pins and a plurality of second pins,
the plurality of first pins are disposed on the first surface of the bonding region, and
the plurality of second pins are disposed on the second surface of the bonding region; and
a plurality of first transmission lines and a plurality of second transmission lines,
wherein a first transmission line of the plurality of first transmission lines is connected to a first pin of the plurality of first pins,
a distance between the first pin and the display region is a first distance,
a second transmission line of the plurality of second transmission lines is connected to a second pin of the plurality of second pins,
a distance between the second pin and the display region is a second distance,
the first distance is approximately equal to the second distance,
the second transmission line and the second pin are disposed at different film layers, and
the plurality of first transmission lines and the plurality of second transmission line are configured to transmit a display signal.

19. A display panel, comprising:
a display region;

a bonding region bonding a flexible circuit board with the display panel,
  wherein the bonding region comprises a first surface located at a displaying side of the display panel and an opposing second surface,
  the bonding region includes a plurality of first pins and a plurality of second pins,
  the plurality of first pins are disposed at the first surface of the bonding region, and
  the plurality of second pins are disposed at the second surface of the bonding region; and
a plurality of first transmission lines and a plurality of second transmission lines,
  wherein a first transmission line of the plurality of first transmission lines is connected to a first pin of the plurality of first pins,
  a second transmission line of the plurality of second transmission lines is connected to a second pin of the plurality of second pins,
  along a direction perpendicular to the display panel, the first pin does not overlap with the second pin,
  the first pin has a first side adjacent to the display region of the display panel and an opposing second side far away from the display region of the display panel,
  the second pin is disposed at the first side of the first pin,
  the second transmission line and the second pin are disposed on different film layers, and
  the plurality of first transmission lines and the plurality of second transmission line transmit display signals.

* * * * *